(12) United States Patent
Alford et al.

(10) Patent No.: US 11,108,381 B2
(45) Date of Patent: Aug. 31, 2021

(54) BANDWIDTH CONFIGURABLE SIGNAL SERVER

(71) Applicant: BAE Systems Information and Electronic Systems Integration Inc., Nashua, NH (US)

(72) Inventors: Bradley R. Alford, Dallas, TX (US); Nathan R. Broyer, Oxford, ME (US); Greg M. Fehling, Hollis, NH (US); Hock J. Lee, Fairview, TX (US); Jeffrey P. Woodward, Nashua, NH (US); John Cummings, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 210 days.

(21) Appl. No.: 16/425,234

(22) Filed: May 29, 2019

(65) Prior Publication Data
US 2020/0382105 A1    Dec. 3, 2020

(51) Int. Cl.
*H03H 17/06* (2006.01)
*H03H 17/00* (2006.01)

(52) U.S. Cl.
CPC ...... *H03H 17/0671* (2013.01); *H03H 17/065* (2013.01); *H03H 17/0685* (2013.01); *H03H 2017/0081* (2013.01); *H03H 2017/0678* (2013.01)

(58) Field of Classification Search
CPC .............. H03H 117/0635; H03H 17/0664
See application file for complete search history.

(56) References Cited

U.S. PATENT DOCUMENTS

| 5,537,435 | A | 7/1996 | Carney et al. |
|---|---|---|---|
| 6,356,569 | B1 | 3/2002 | Sonalkar et al. |
| 6,611,855 | B1 | 8/2003 | Hellberg et al. |
| 8,514,982 | B2 | 8/2013 | Dubash et al. |
| 9,287,993 | B1 | 3/2016 | Adleman et al. |
| 2014/0241469 | A1 | 8/2014 | Seely et al. |
| 2017/0012596 | A1* | 1/2017 | Harris ............... H03H 17/0266 |

(Continued)

OTHER PUBLICATIONS

International Search Report, PCT/US2020/034689, dated Aug. 25, 2020, 14 pages.

*Primary Examiner* — Chuong D Ngo
(74) *Attorney, Agent, or Firm* — Finch & Maloney PLLC; Scott J. Asmus

(57) ABSTRACT

A digital signal processor is designed to channelize an input signal, and includes a channelizer circuit and a plurality of tuning modules. The channelizer circuit is designed to receive an input signal having a first bandwidth and to channelize the input signal into a first set of channels each having a bandwidth smaller than the first bandwidth as a first output signal and to channelize the input signal into a second set of channels having a bandwidth smaller than the first bandwidth as a second output signal. The plurality of tuning modules are designed to receive one or more channels from the first output signal or the second output signal and to further downsample the one or more channels to a user-defined bandwidth at a user-defined center frequency. Each of the plurality of tuning modules include a plurality of FIR filter blocks and a memory having a plurality of FIR filter coefficients.

18 Claims, 9 Drawing Sheets

(56) References Cited

U.S. PATENT DOCUMENTS

2019/0104002 A1* 4/2019 Thompson ............. H04B 7/005
2020/0036398 A1* 1/2020 Scott ....................... G01S 7/288
2020/0059222 A1* 2/2020 Cheung ............. H03H 17/0275

* cited by examiner

BANDWIDTH CONFIGURABLE SIGNAL SERVER

BACKGROUND

Many signal intelligence systems rely on data streams from tuners that produce digital samples to feed digital signal processing applications. General approaches to turning the full-bandwidth RF stream (at a given digitized bandwidth) into channels of lower-bandwidth data can overload a system's computational resources. Some other systems have controllable digitization bandwidth and operate in a 'dedicated' mode where a receiver asset is dedicated to one application regardless of whether that application needs all of, or just a tiny fraction of the bandwidth supported by the receiver. There are significant drawbacks, and several non-trivial issues, to these approaches.

BRIEF DESCRIPTION OF THE DRAWINGS

Features and advantages of embodiments of the claimed subject matter will become apparent as the following Detailed Description proceeds, and upon reference to the Drawings, in which:

Although the following Detailed Description will proceed with reference being made to illustrative embodiments, many alternatives, modifications, and variations thereof will be apparent in light of this disclosure.

DETAILED DESCRIPTION

Techniques are disclosed for channelizing an input signal into a plurality of output channels, each defined by a center frequency and bandwidth. The system selects a particular channel from the plurality of output channels to satisfy a request for a particular portion of the input signal. The request may be received from a user requesting a particular center frequency and bandwidth or operate autonomously according to instructions from computing resources. As used herein, user is defined to be one or more parties requesting a portion of the input signal or a computer generated request employing independent processing capability. A channelizing module is disclosed that is dynamically scalable and controllable to output a large number of simultaneous channels of varying bandwidths to ensure fast and efficient location of a channel that closely matches the requested portion of the input signal. The selected channel may then be finely tuned to more closely match the exact center frequency and bandwidth that was requested.

According to an embodiment of the present disclosure, a digital signal processor is designed to channelize an input signal, and includes a channelizer circuit and a plurality of tuning modules. The channelizer circuit is designed to receive an input signal having a first bandwidth and to channelize the input signal into a first set of channels each having a bandwidth smaller than the first bandwidth as a first output signal and to channelize the input signal into a second set of channels having a bandwidth smaller than the first bandwidth as a second output signal. The plurality of tuning modules are designed to receive one or more channels from the first output signal or the second output signal and to further downsample the one or more channels to a user-defined bandwidth at a user-defined center frequency. Each of the plurality of tuning modules include a plurality of FIR filter blocks and a memory having a plurality of FIR filter coefficients.

General Overview

Figure 1:
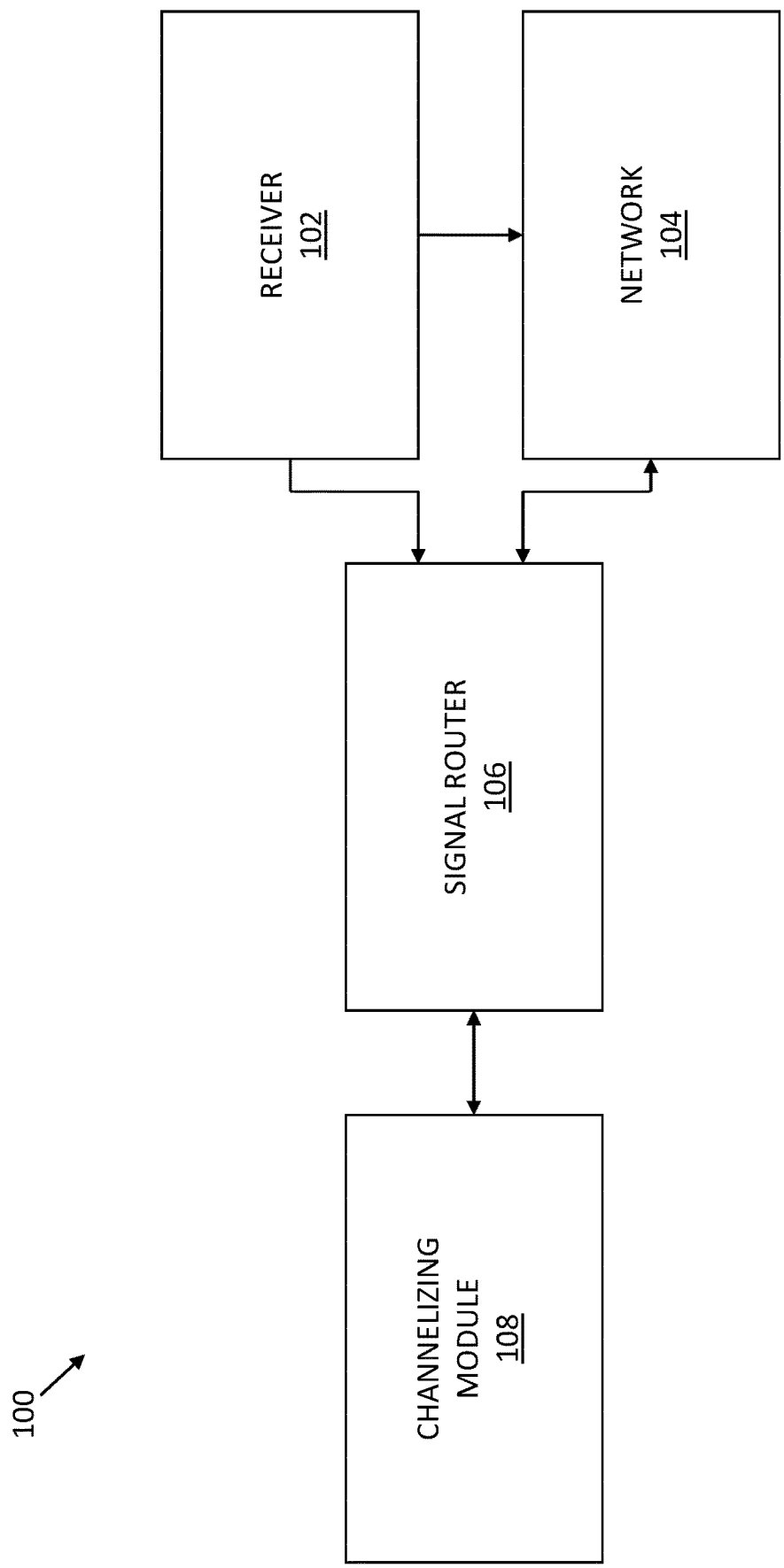
FIG. 1 illustrates a signal processing environment, in accordance with some embodiments of the present disclosure.

FIG. 1 illustrates an example data signaling environment 100 having a receiver 102, a network 104, a signal router 106, and a channelizing module 108, according to an embodiment. Data signaling environment 100 may exist anywhere where RF signals are to be received and data is to be extracted from user-defined portions of the received RF signals. In some other embodiments, data signaling environment 100 receives digital signals and extracts user-defined portions of the digital signals.

Receiver 102 may be an analog receiver having one or more antennas for receiving an RF signal. Any number and type of antenna may be used, such as antenna arrays, patch antennas or strip antennas. One or more of the antennas may be designed to support multiple communication bands (e.g., dual band operation or tri-band operation). In some examples, the one or more antennas of receiver 102 are designed to capture signals having a desired frequency range, gain, polarization, or beamwidth. Receiver 102 also includes a downconverter to generate an intermediate frequency (IF) and an analog to digital converter (ADC) to digitize the received signal. The ADC may be configured to convert signals having a bandwidth of about 80 MHz at a sample rate of around 100 mega-samples per second (Msps). In some embodiments, receiver 102 includes an ethernet interface module to condition the digitized signal for transport across an ethernet network. In some embodiments, receiver 102 is a digital receiver that receives and conditions a digital input signal for transport to one or both of network 104 and signal router 106.

Network 104 represents one or more other systems interconnected via any data network that has access to the signal received at receiver 102. According to some embodiments, receiver 102 sends the received signal to network 104 to be received by any one of the one or more other systems. A user receiving the signal at any of the one or more other systems may request a particular portion of the signal. For example, for an input signal having an 80 MHz bandwidth, a user may request a portion of the signal centered at 10 MHz with a bandwidth of 1 MHz. The input signal may then be passed on to signal router 106 and channelizing module 108 to generate the user-requested signal, which is then passed back through signal router 106 and out to the user on network 104. In some embodiments, the received signal at receiver 102 is passed directly to signal router 106 before either being sent to network 104 or to channelizing module 108.

Signal router 106 represents any data routing or switching architecture, according to an embodiment. In some examples, signal router 106 is an ethernet switch. Signal router 106 may receive any number of input signals from receiver 102 (or a plurality of receivers) and pass the signals onto a channelizing module 108. Signal router 106 also receives the outputted downsampled signals from channelizing module 108 and routes the signals to their respective destinations on network 104.

Channelizing module 108 includes various components arranged to channelize one or more received signals into a plurality of down-sampled output channels, thus allowing for the selection of particular bandwidth portions of the one or more received signals. Channelizing module 108 may be implemented as a field programmable gate array (FPGA) on a printed circuit board (PCB). Channelizing module 108 may be a component of a larger computer system, such as a board that is coupled to a system motherboard or used in a server architecture.

Channelizing Module

Figure 2:
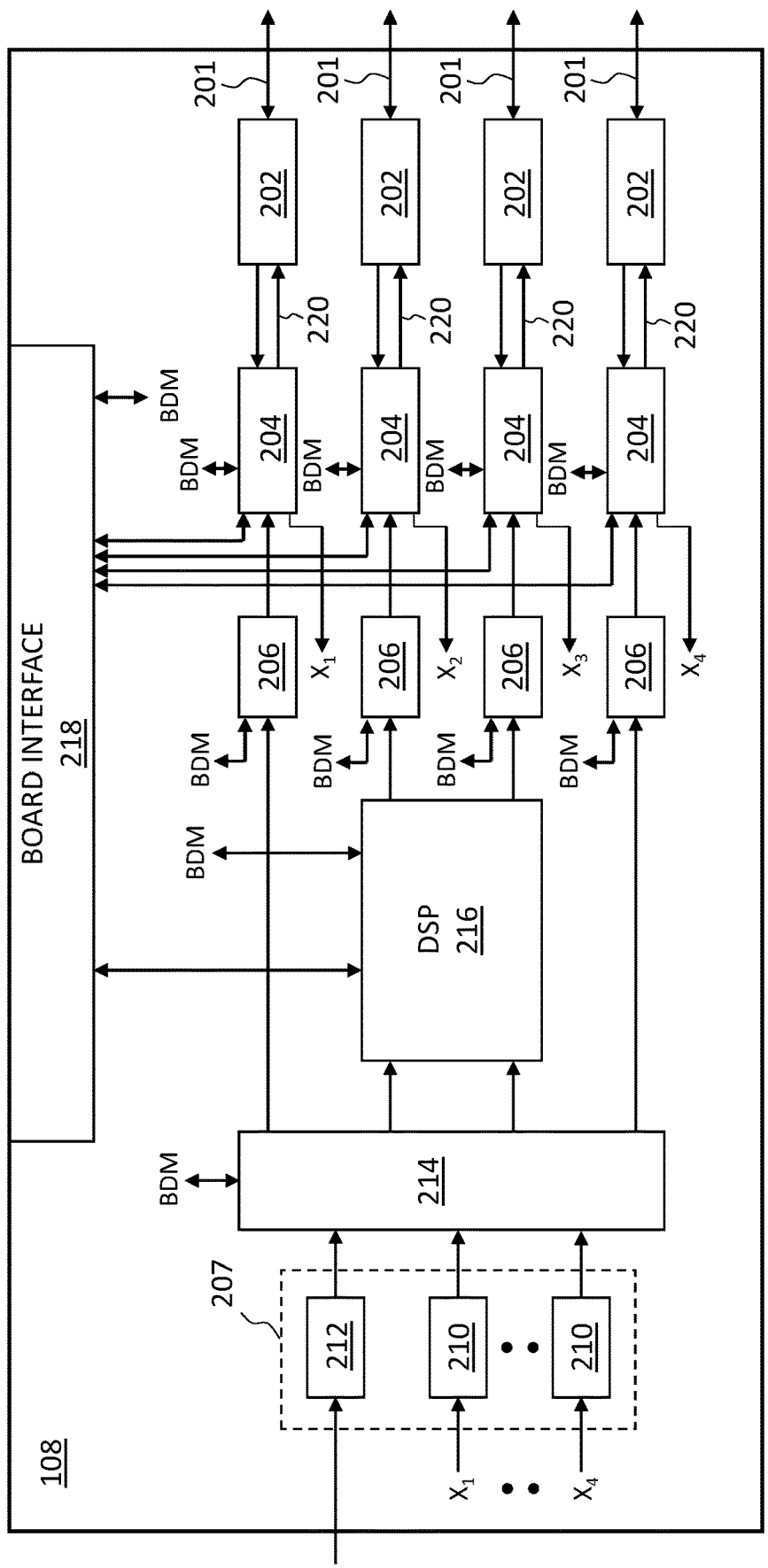
FIG. 2 illustrates an example channelizing module, in accordance with an embodiment of the present disclosure.

FIG. 2 illustrates an example implementation of channelizing module 108, according to an embodiment. Channelizing module 108 receives one or more input signals from signal router 106 across I/O lines 201. In one example, the input signals are portions of the receiver signal from FIG. 1. Four simultaneous inputs are illustrated, each having a similar path through like-labeled components. Any number of simultaneous inputs could be implemented and may only be limited by practical considerations, such as space on the board or required computational power from processor 216. According to some embodiments, the input signals received on I/O lines 201 adhere to the VITA 49.2 protocol.

The input signals may first be received by network interface modules 202. In some embodiments, network interface modules 202 receive signals from a particular network type (e.g., an ethernet network) and condition the signals to interface with the components of channelizing module 108, and visa-versa.

A plurality of switching circuits 204 may be provided to route the input signals to a particular destination on channelizing module 108. In some examples, switching circuits 204 either route the input signals towards processor 216 to be channelized, or route the input signals to a board bus (BDM). Although not illustrated for clarity, the board bus BDM connects with many of the components of channelizing module 108 and allows for data flow between one or more of the components. The board bus BDM also connects to board interface 218 which allows for data transfer to/from channelizing module 108 and other components electrically coupled with channelizing module 108. An example of board interface 218 is a PCI connection. Board interface 218 may also be used to access off-module SDRAM memory.

Channelizing module 108 includes a signal conditioning bank 207 having a plurality of signal conditioning circuits, according to some embodiments. The signal conditioning circuits may be provided to strip the ethernet-related data from the input signals thus allowing downstream components of channelizing module 108 to function correctly with the input signals. In other examples, the signal conditioning circuits perform any kind of conditioning to the input signals such that they are in the correct format for modulation by processor 216.

Outputs from switching circuits 204 that are routed towards processor 216 are identified as $X_1$, $X_2$, $X_3$, and $X_4$. These outputs are shown being received by one or more of the signal conditioning circuits 210. Another signal conditioning circuit 212 may be provided to receive an optional input signal from another source, such as for example, from an optical source.

Signal outputs from signal conditioning bank 207 may be received by a routing module 214 designed to select an output path amongst a plurality of output paths for any of the given signal inputs. One or more of the output paths are received by processor 216 for digital downsampling while one or more other output paths bypass processor 216 completely. Routing module 214 may include multiplexers or any other circuits designed to select an output path for a given input signal.

Processor 216 may be a digital signal processor or microcontroller and is configured to provide user-defined downsampling and filtering of one or more received input signals. Two parallel inputs into processor 216 are illustrated in FIG. 2, but any number of parallel inputs can be used. Processor 216 also interfaces with board interface 218 to receive off-board commands or to send data to other off-board systems. In some embodiments, processor 216 accesses off-board memory (e.g., SDRAM) via board interface 218. The channelizing operations of processor 216 are discussed in more detail with reference to FIGS. 4-6. Processor 216 can control and operate one or more of any of the other components of channelizing module 108 via bus connection BDM.

In some embodiments, the input signals are encoded using a particular network protocol (such as VITA 49.2). In such situations, the protocol header information may be stripped from the input signals before they are received by processor 216. For example, the protocol header information may be stripped from the signals directly before being received by processor 216. Similarly, the protocol header information may be reapplied to the output signals from processor 216. For example, the protocol header information may be reapplied to the processor output signals directly after being outputted from processor 216. In this way, the downsampled output signals also adhere to whatever network protocol is used by the input signals.

Downsampled signal outputs from processor 216, as well as the raw input signal data which bypassed processor 216, are received by additional conditioning circuits 206, according to some embodiments. Additional conditioning circuits 216 may be provided to modify the signals in order to be successfully transmitted off of channelizing module 108. For example, additional conditioning circuits 206 may reapply ethernet header information to the signals such that they can be successfully transmitted across an ethernet network.

The signal outputs from additional conditioning circuits 206 are received by switching circuits 204, according to some embodiments. Switching circuits 204 may select whether to output signals received from bus BDM or signals received from additional conditioning circuits 206 on output line 220. The signals from bus BDM may represent other signals (i.e., not the downsampled data signals) received from any of the components of channelizing module 108. In one example, these "other signals" may be command or control signals received from processor 216 that are to be outputted via output line 220.

The outputted downsampled data signals are sent across output line 220, after crossing though switching circuits 204, and are received by network interface modules 202 to be modified for transmission across a particular network type (e.g., ethernet network). The outputted downsampled data signals are transmitted across I/O lines 201 back to signal router 106 for transmission to network 104. Similarly, the raw data signals that did not get downsampled by processor 216 can also be transmitted across I/O lines 201 back to signal router 106 for transmission to network 104.

Figure 3:
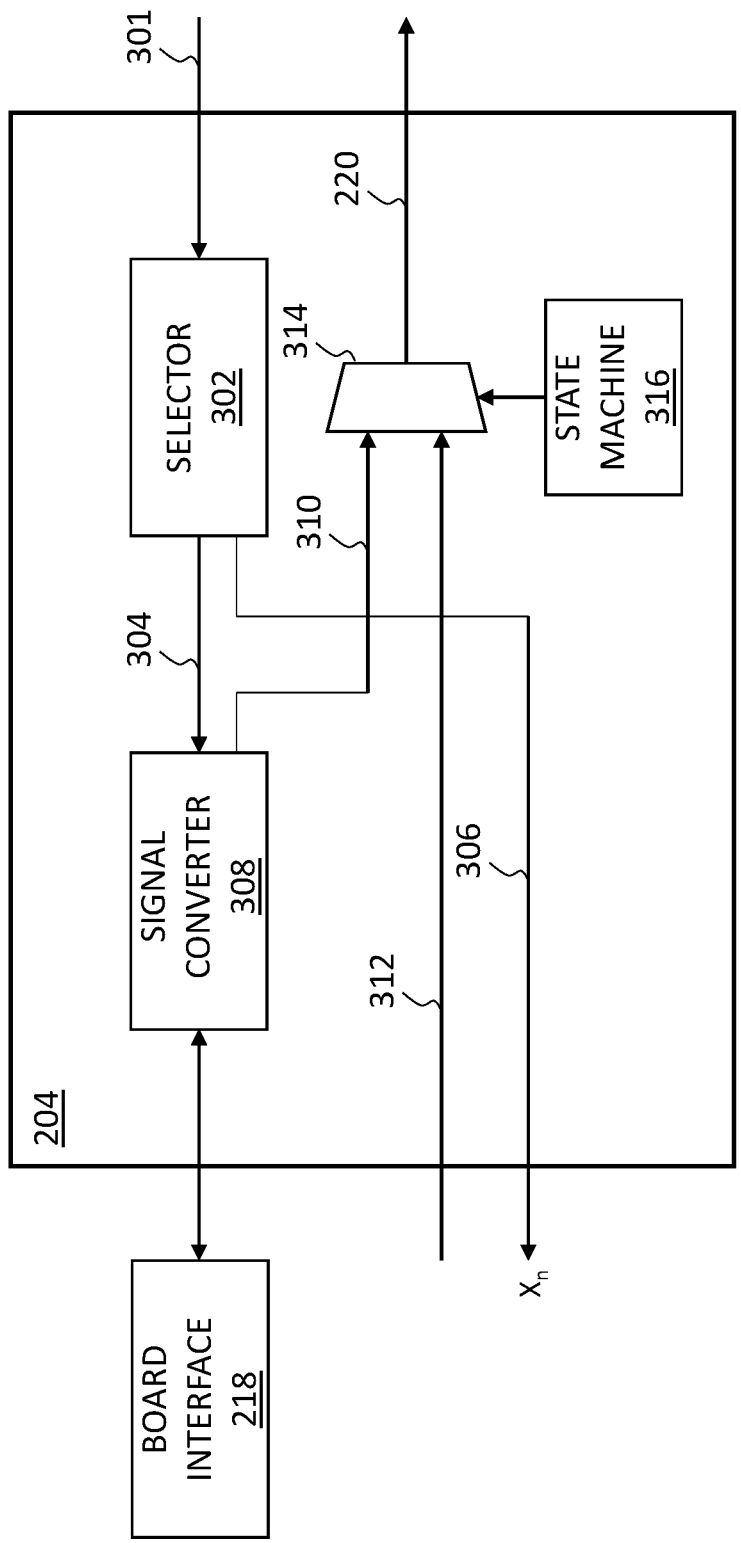
FIG. 3 illustrates an example selection circuit, in accordance with an embodiment of the present disclosure.

FIG. 3 illustrates a more detailed schematic of switching circuit 204, according to an embodiment. Switching circuit includes a selector module 302, a signal conversion module 308, a multiplexing circuit 314, and a state machine 316.

Selector module 302 receives an input signal on input line 301. The input signal may include a signal having a relatively large bandwidth (e.g., 80 MHz or greater) which is to be channelized by channelizing module 108. Selector module 302 includes multiplexer or splitter circuits designed to route the input signal onto one or both of output line 304 and output line 306. Output line 304 delivers the signal to conversion module 308 where the signal is conditioned for transmission off of the board via board interface 218 (e.g., using a PCI interface). Output line 306 delivers the input signal on towards processor 216 to be channelized. A plurality of switching circuits 204 may be implemented in parallel to produce multiple output signals denoted as Xn where n represents a particular one of the outputs.

The channelized output signals are also received by switching circuit 204 on input line 312, according to an embodiment. Additional input signals received from off the board via board interface 218, or from any other component of channelizing module 108, such as command/control signals from processor 216, may also be received back through signal conversion module 308 and onto input line 310. Multiplexing circuit 314 may be implemented to choose between the channelized signal on input line 312 and other signals received via board interface 218 on input line 310. According to some embodiments, state machine 316 provides the one or more selector bits to multiplexer 314. In one example, state machine 316 is designed such that the priority is to select the signal on input line 310. The signal output of multiplexer 314 is provided on output line 220, which may be received by network interface module 202 before being transmitted back across the network (e.g., to a user requesting the channelized output).

It should be understood that one or more of the various I/O lines 301, 304, 306, 310, 312, and 220 may be actual metal traces provided on channelizing module 108. In some other examples, one or more of the various I/O lines represent logical connections being made between different functions of a same component.

Figure 4:
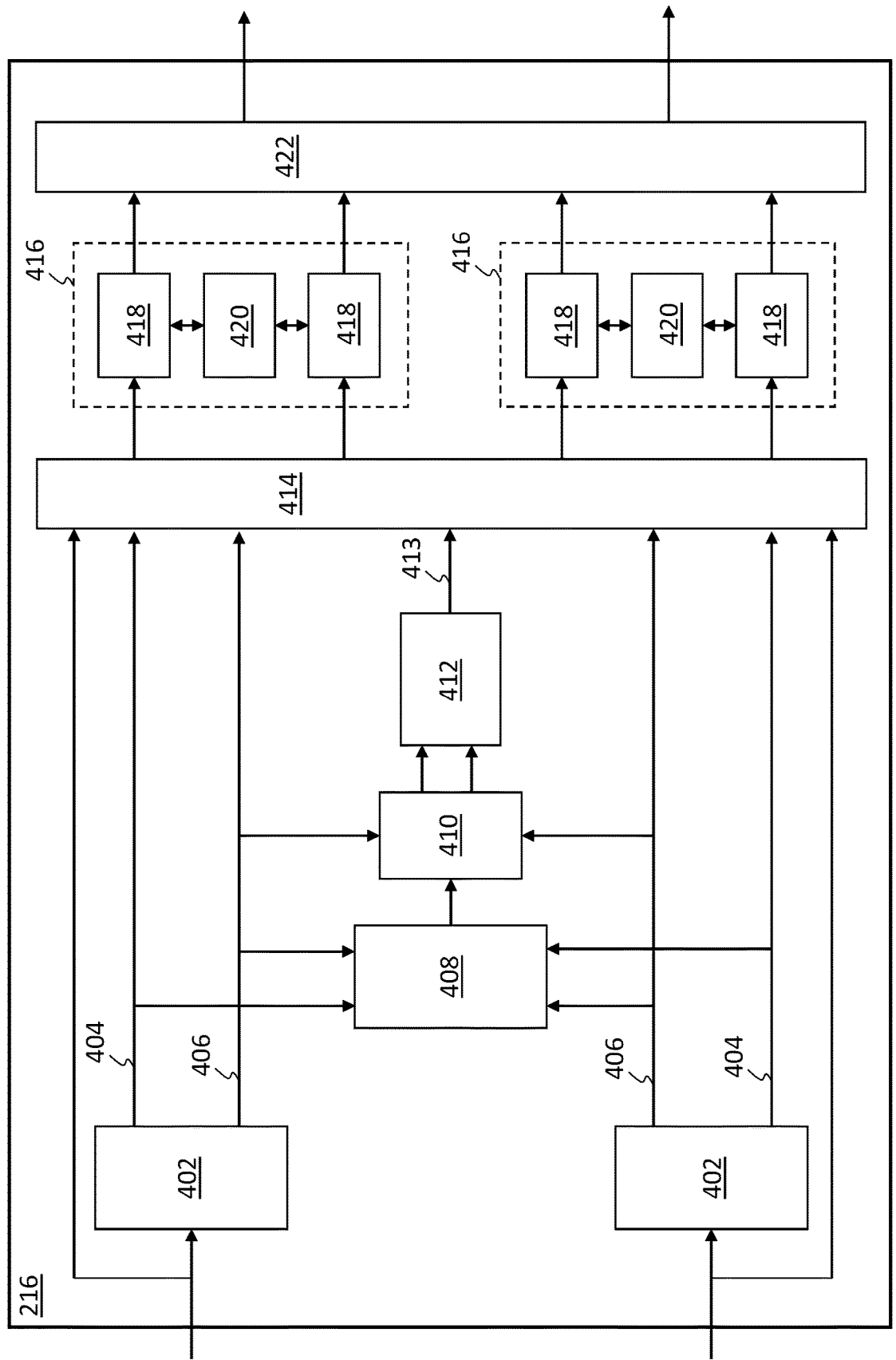
FIG. 4 illustrates an architecture for a digital signal processor, in accordance with an embodiment of the present disclosure.

FIG. 4 illustrates a more detailed schematic of processor 216, according to an embodiment. Processor 216 may include one or more channelizing circuits 402, a memory 408, a routing circuit 410, a fine channelizing circuit 412, a routing circuit 414, one or more tuning modules 416, and a packetizing circuit 422.

Two channelizing circuits 402 are illustrated. In some embodiments, any number of channelizing circuits 402 are included within processor 216 to provide parallel channelization on any number of input signals. For clarity, the features of a single channelizer will be discussed herein.

Channelizing circuit 402 receives an input signal having an input bandwidth and channelizes the signal onto two outputs. In some embodiments, a first output 404 includes a first output signal having a first set of channels with each channel having a bandwidth smaller than the input bandwidth and a second output 406 includes a second output signal having a second set of channels with each channel having a bandwidth smaller than the input bandwidth, or smaller than both the input bandwidth and the bandwidth of each of the first set of channels. The first and second set of channels may be different from one another. For example, an input signal having a total bandwidth of 100 MHz can be channelized into 16 channels with each channel having a bandwidth of about 16.25 MHz, and also channelized into 160 channels with each channel having a bandwidth of about 1.625 MHz. The output with 16 channels may be provided as output 404 while the output with 160 channels may be provided as output 406. According to an embodiment, the bandwidths of adjacent channels overlap as will be discussed in more detail later.

In some embodiments, the channelized outputs from channelizing circuit 402 may be received by memory 408, such that they are temporarily stored for a given period of time. By storing the channelized output over time, a user may access prior channelized signals.

In some embodiments, router circuit 410 receives channelized output signals from one or more of channelizing circuits 402 and provides the signals to a fine channelizing circuit 412, where they can be further channelized into even finer-bandwidth channels. According to an embodiment, fine channelizing circuit 412 produces a channelized output 413 having a third set of channels greater than either the first set of channels or the second set of channels. Continuing the example provided earlier, router circuit 410 may receive output 406 having 160 channels from one or more of channelizing circuits 402 and provide the signals to fine channelizing circuit 412, which produces an output 413 having up to 320 channels with a bandwidth per channel between about 10 kHz and 800 kHz. In some embodiments, fine channelizing circuit 412 is used only when a request is made for a very small signal bandwidth (e.g., less than 100 kHz).

By forming multiple parallel channelized outputs having different bandwidths per channel, various levels of coarseness are created for breaking up the bandwidth of the original signal. This then makes the process of selecting a requested portion of the original signal more streamlined. For example, if a user requests a portion of the original signal having a bandwidth of about 10 MHz, output 404 having 16 channels at a bandwidth per channel of 16.25 MHz may be used as it provides portions of the original signal having a bandwidth closest to the user's request. Furthermore, which of the 16 channels is selected is determined by the user-defined center frequency. Whichever channel includes the user-defined center frequency and has the bandwidth that encompasses the user-requested bandwidth is the one that will be chosen. The channelized signal at output 404 can then be finely downsampled using tuner circuits 416 to more closely match the user's requested 10 MHz bandwidth. In another example, if a user requests a portion of the original signal having a bandwidth of about 1 MHz, output 406 having 160 channels at a bandwidth per channel of 1.625 MHz may be used as it provides portions of the original signal having a bandwidth closest to the user's request. Furthermore, which of the 160 channels is selected is determined by the user-defined center frequency. Whichever channel includes the user-defined center frequency and has the bandwidth that encompasses the user-requested bandwidth is the one that will be chosen. The channelized signal at output 406 can then be finely downsampled using tuner circuits 416 to more closely match the user's requested 1 MHz bandwidth. Even smaller requested bandwidths (e.g., bandwidths less than 100 kHz) may be satisfied using the channelized output from fine channelizing circuit 412 in a similar manner to the examples discussed above. According to some embodiments, each of channelized outputs 404, 406, and 413 is further downsampled using tuner circuits 416.

Routing circuit 414 receives all of the various downsampled and channelized outputs, including the raw input signal(s), and provides selected one or more of the received signals on to the tuning modules 416 for finer downsampling and center frequency tuning, according to some embodiments.

As discussed above, the various outputs from channelizing circuits 402 and fine channelizing circuit 412 may represent various levels of "coarse" downsampling of the original input signal. According to some embodiments, finer downsampling of the channelized outputs is performed by tuning modules 416. According to some embodiments, each tuning module 416 includes one or more finite impulse response (FIR) filter blocks 418, and a memory 420 for storing the FIR filter coefficients used by the one or more FIR filter blocks 418. FIR filter blocks 418 can provide fractional downsampling of the received channelized signals as well as frequency tuning to a user-defined center frequency. The downsampling may be performed down to a fractional rate of about ⅟₃₂, although in some embodiments cascaded filter blocks may be used to achieve larger downsample factors. Further details of the FIR filter blocks 418 are provided with reference to FIG. 6.

The finely tuned and finely downsampled signal output(s) from tuning modules 416 is received by a packetizing circuit 422 to be packetized for transmission back across the network (e.g., an ethernet network).

Figure 5:
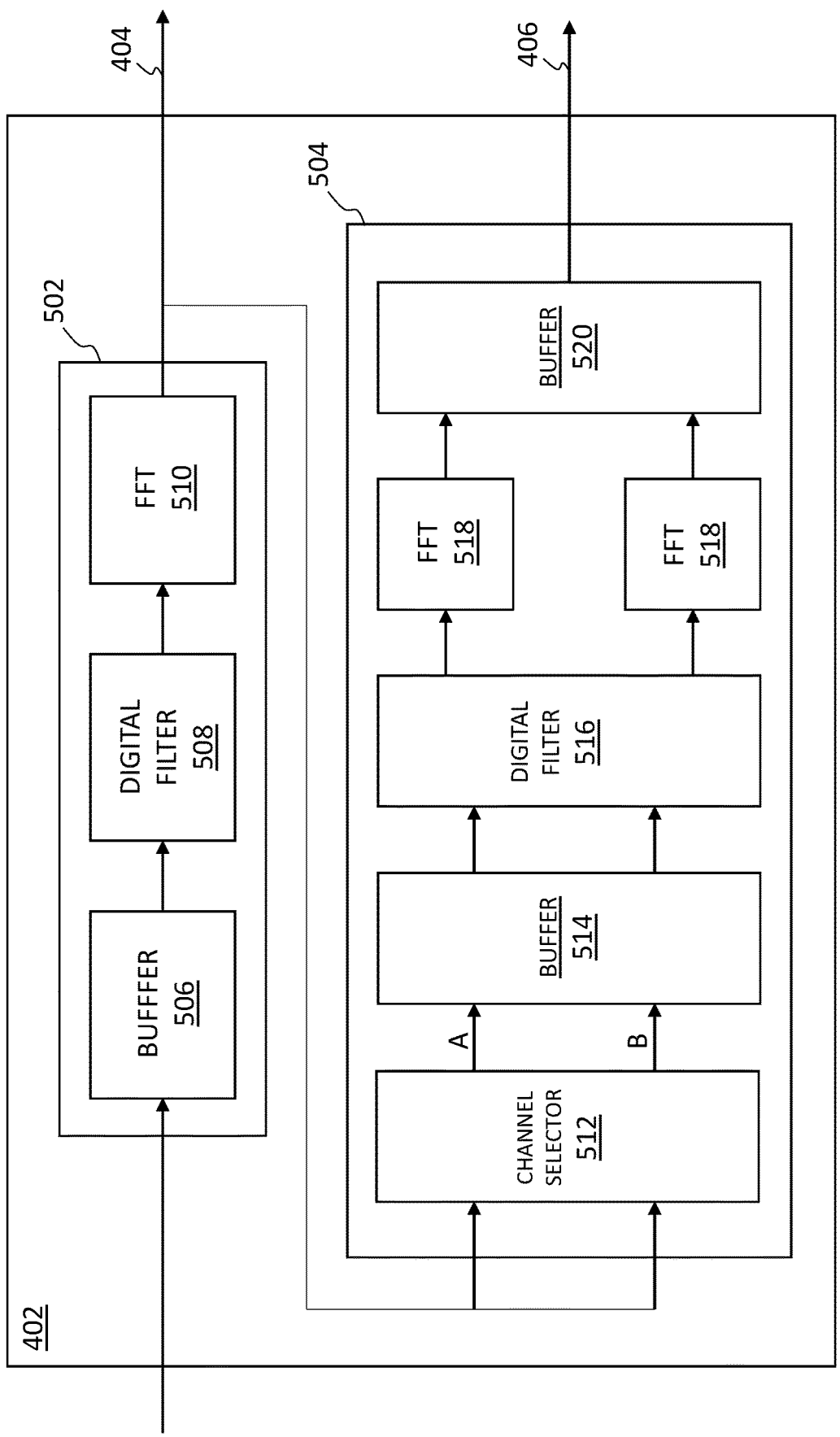
FIG. 5 illustrates an architecture for a channelizing circuit, in accordance with some embodiments of the present disclosure.

FIG. 5 illustrates a more detailed schematic of channelizing circuit 402, according to an embodiment. Channelizing circuit 402 may include a first channelizer 502 producing a first set of channels (also called "bins") and a second channelizer 504 producing a second set of channels (bins), having finer bandwidth/spacing than the first set of channels.

First channelizer 502 includes a buffer 506, a digital filter 508, and an FFT block 510, according to some embodiments. Buffer 506 receives the input signal and may provide a delay before sending the signal on to digital filter 508. In some examples, buffer 506 is a first in first out (FIFO) buffer.

Digital filter 508 may be used to determine characteristics that define each of the channels (e.g., bandwidth, passband ripple, stopband rejection, etc.) In some embodiments, digital filter 508 includes a weighted-overlap-add (WOLA) function that expands the bandwidth of each channel such that the bandwidths of adjacent channels overlap, and provides the benefit of increased stopband rejection. Overlapping the bandwidths ensures that a particular channel can always be chosen to satisfy a request for a particular portion of the signal (e.g., having a particular center frequency and bandwidth). This assumes that requests cannot be made for signal portions having bandwidths that are higher than the largest channel bandwidth. For example, for a channelized output signal having 16 channels with a bandwidth of 16.25 MHz per channel, requests cannot be satisfied for signal portions having a bandwidth greater than 16.25 MHz. In another example, requests for signal portions having a bandwidth of exactly 16.25 MHz (e.g., the highest channel bandwidth) could only be satisfied at the center frequency for each of the 16 channels.

At FFT block 510, a fast Fourier transform is performed to generate various portions of the input signal across the frequency spectrum. Continuing the example provided above, a 16 point FFT may be used to provide 16 channels across a 100 MHz frequency bandwidth (each spaced apart by 6.25 MHz.)

Second channelizer 504 includes a channel selector 512, a buffer 514, a digital filter 516, one or more FFT blocks 518, and a second buffer 520, according to some embodiments.

Channel selector 512 may be provided to parallelize the input signal across two or more paths for easier computation. Since the input signal into second channelizer 504 is provided from the output of first channelizer 502, the input signal into second channelizer 504 already includes a first set of channels. Thus, channel selector 512 may provide a first subset of the first set of channels across path A and a second subset of the first set of channels across path B. Continuing the example provided above, 16 input channels may be split up such that channels 0, 4, 8, and 12 are transmitted along path A and channels 2, 6, 10, and 14 are transmitted along path B. Due to the bandwidth overlap between channels, the odd channels contain redundant signal information and thus can be ignored. In another example, the odd channels may be split up across paths A and B while the even channels are ignored.

Buffer 514 receives both signal paths A and B and may provide a delay before sending the signals on to digital filter 516. In some examples, buffer 514 is a FIFO buffer.

Digital filter 516 may be designed to break up the input signals into even more channels of smaller bandwidth. Digital filter 516 may operate in substantially the same way as digital filter 508 but may contain more taps so as to satisfy stricter spectral response requirements. Accordingly, digital filter 516 may also include a weighted-overlap-add (WOLA) function, so as to improve stopband rejection, and to expand the bandwidth of each channel such that the bandwidths of adjacent channels overlap.

At one or more FFT blocks 518, a fast Fourier transform is performed to generate finer (As compared to the output of FFT block 510) portions of the input signal across the frequency spectrum. Continuing the example provided above, a 32-point FFT may be used to provide 256 channels across a 100 MHz frequency bandwidth. At buffer 520, a number of channels may be dropped from the generated 256 channels. For example, only 160 channels of the 256 are kept, thus creating an output signal at output 406 consisting of 160 channels distributed across a bandwidth of 100 MHz (each spaced apart by 625 kHz.)

Figure 6:
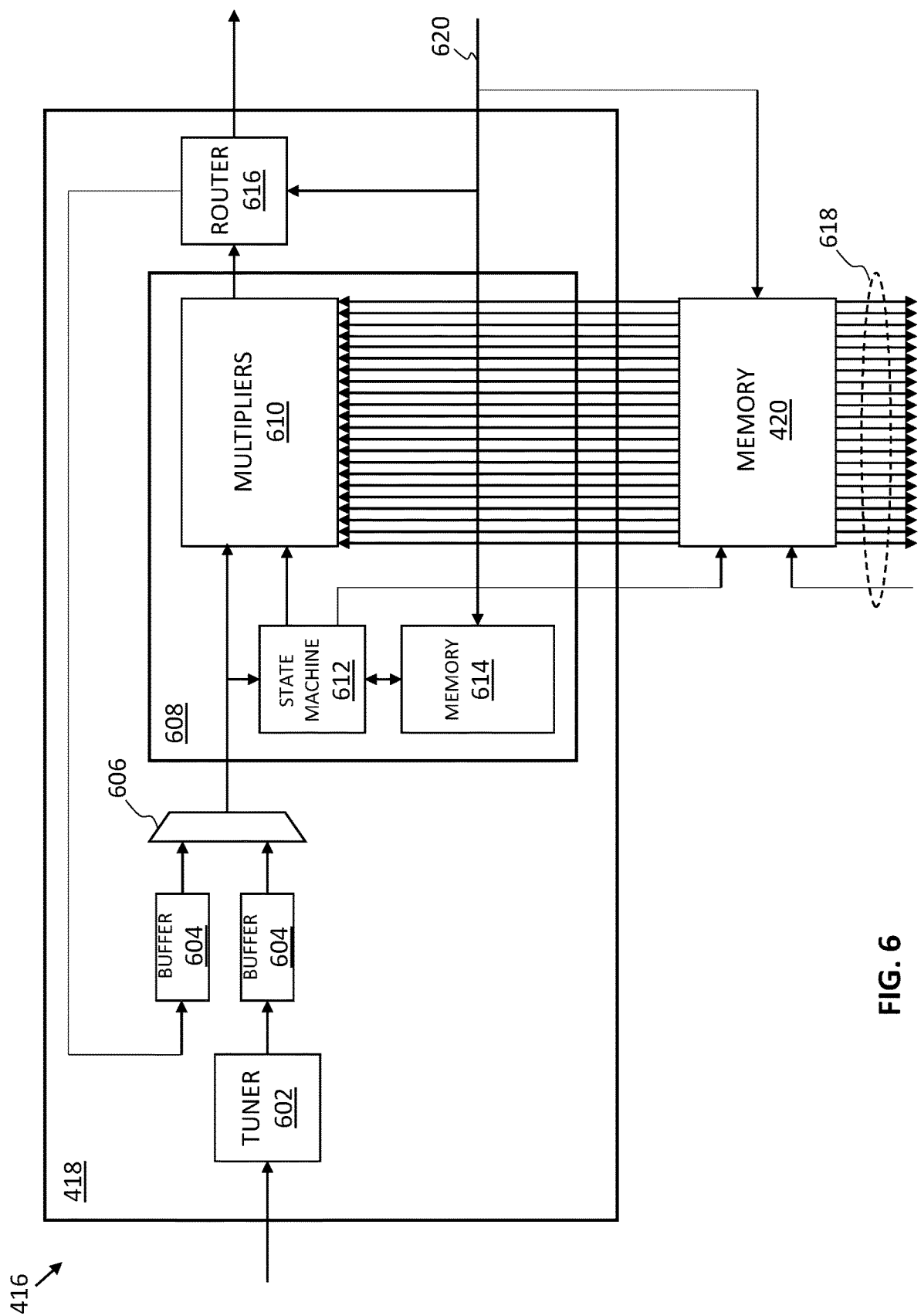
FIG. 6 illustrates an architecture for a tuning module, in accordance with some embodiments of the present disclosure.

FIG. 6 illustrates a more detailed schematic of tuning module 416 having an FIR filter block 418 interfacing with memory 420, according to an embodiment. FIR filter block 418 includes a tuning circuit 602, buffers 604, a multiplexer 606, a downsampling engine 608, and a routing circuit 616.

Tuner 602 receives any one of the channels produced by one or more channelizing circuits 402, or fine channelizing circuit 412, and tunes the signal to a user-defined center frequency. For example, if a request is made for a portion of the input signal centered at 20 MHz with a 10 MHz bandwidth, one of the 16 channels from output 404 that includes the bandwidth range from 15 MHz to 25 MHz would be chosen and routed to tuner 602. However, since the chosen channel may not be centered at 20 MHz (it merely includes the requested bandwidth range), tuner 602 centers the signal at 20 MHz. In some embodiments, tuner 602 centers the signal at a particular frequency using a numerically controlled oscillator (NCO).

The frequency-centered output from tuner 602 may be received by a buffer 604 before passing through a multiplexer 606 and onto downsampling engine 608 where the signal is further finely downsampled to match the requested bandwidth. Continuing the example provided above, each of the 16 channels has a bandwidth of 16.25 MHz, thus the chosen channel must be further downsampled to match the requested 10 MHz of bandwidth (e.g., from 16.25 MHz down to 10 MHz.) This downsampling may be performed by downsampling engine 608.

According to some embodiments, downsampling engine 608 includes a plurality of multiplier circuits 610, a state machine 612, and a memory 614. Multiplier circuits 610 may be designed to provide further fractional downsampling of the received signal. For example, multiplier circuits 610 may downsample the signal at a rate down to as low as $\frac{1}{16}$, $\frac{1}{32}$, $\frac{1}{64}$, or $\frac{1}{128}$ of the frequency bandwidth. In some embodiments, multiplier circuits 610, in conjunction with state machine 612 and memory 614, are designed to provide fractional downsampling by a ratio of U/D, where each of U and D is an integer ranging anywhere from 1 to 32. Cascaded downsampling engines 608 may be used to achieve any other downsampling ratios. Multiplier circuits 610 may include a plurality of digital filters having coefficients stored in memory 420. In some embodiments, the filter coefficients are loaded into memory 420 once and remain there for the operational duration of the system. As shown in the lower part of FIG. 6, memory 420 is also accessed by one or more other signal lines 618 that interface with another tuner module 416.

State machine 612, along with memory 614 that contains the microcode instructions for operating state machine 612, may be provided to control the computational cycles being performed by multiplier circuits 610 to ensure a more efficient operation for each clock cycle.

In some embodiments, the downsampled output from multiplier circuits 610 is provided to routing circuit 616 where it can be transmitted on to packetizing circuit 422, or it is fed back and selected via multiplexer 606 to once again be downsampled by downsampling engine 608. In this way, numerous downsampling iterations may be performed.

According to some embodiments, one or more external signals 620 provided by processor 216, or from other components across the board bus BDM, are used to write data in one or both of memory 614 and memory 420. Additionally, external signals 620 may be used to control the operation of routing circuit 616 to determine signal routing for the downsampled output signal from downsampling engine 608. In some embodiments, routing circuit 616 facilitates the cascading of multiple FIR filter blocks 418 or downsampling engines 608.

Figure 7:
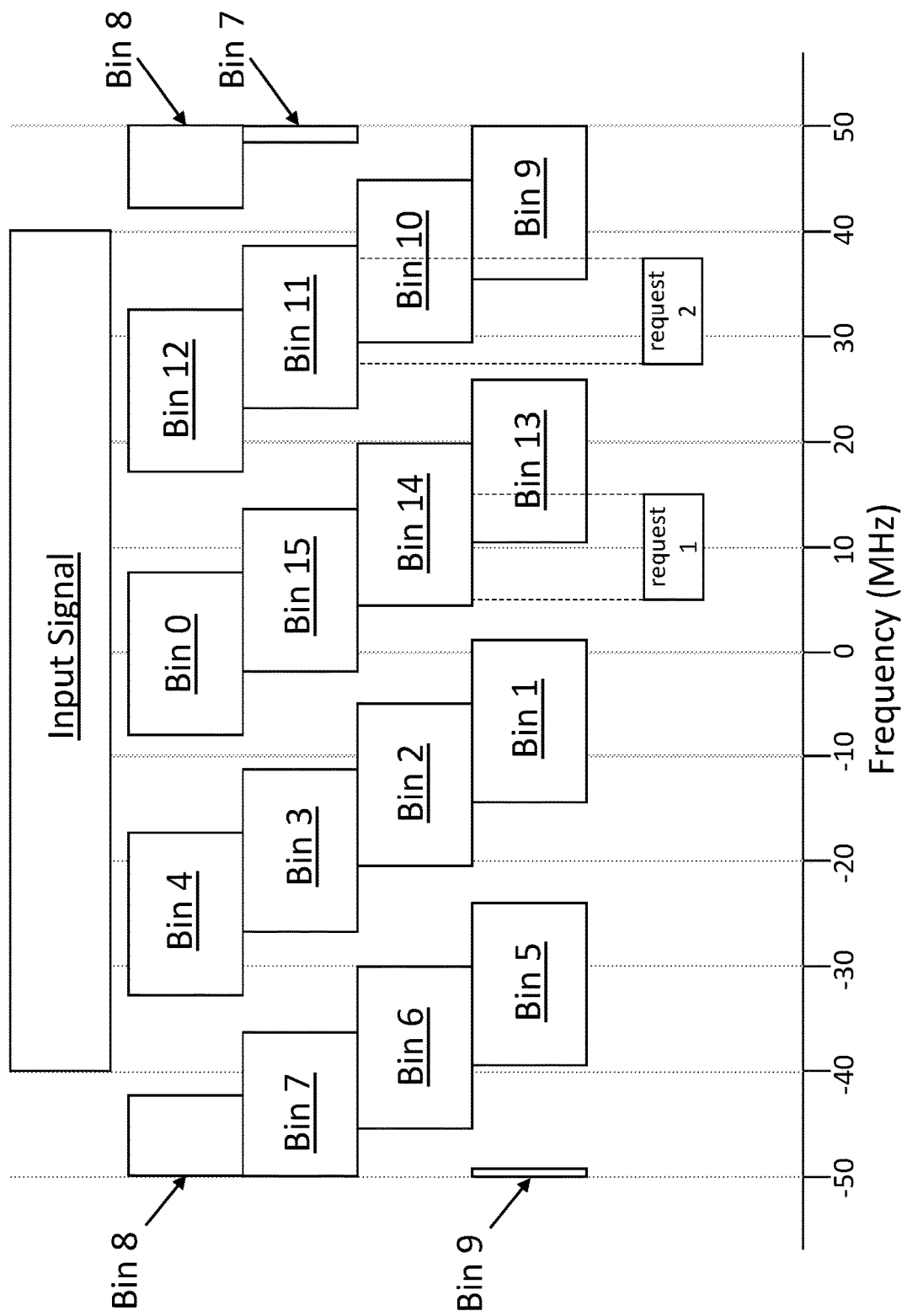
FIG. 7 illustrates a representation of a channelized signal into 16 bins across a portion of the frequency spectrum, in accordance with some embodiments of the present disclosure.

FIG. 7 illustrates how particular channels (bins) are chosen based on a requested portion of the input signal bandwidth, according to an embodiment. As illustrated, an input signal has a bandwidth of 80 MHz, although other signal bandwidths are possible as well. The 80 MHz input signal is channelized into a plurality of smaller bandwidth channels (bins), with each bin having an overlapping bandwidth with adjacent bins. The amount of overlap may be determined based on the WOLA function used by digital filter 508.

In the illustrated example, the input signal is channelized into 16 bins stretching across 100 MHz of total bandwidth. Each bin may have a bandwidth of around 16.25 MHz and a spacing of about 6.25 MHz.

Some example requests for portions of the input signal are also illustrated. In a first example, a first request for a portion of the input signal may be for a signal having a center frequency at 10 MHz with a 10 MHz bandwidth. Bin 14 provides the bandwidth necessary in the correct location of the spectrum to provide the requested signal. Thus, bin 14 would be selected and tuned to the requested center frequency of 10 MHz using tuner 602, and further downsampled by downsampling engine 608 to match the user's requested bandwidth. In a second example, a second request for a portion of the input signal may be for a signal having a center frequency at 33 MHz with a 10 MHz bandwidth. Bin 11 provides the bandwidth necessary in the correct location of the spectrum to provide the requested signal. Thus, bin 11 would be selected and tuned to the requested center frequency of 33 MHz using tuner 602, and further downsampled by downsampling engine 608 to match the user's requested bandwidth.

The example provided above only illustrates the channelized output that has 16 channels (e.g., the channels with the largest bandwidth). Requests for smaller signal bandwidths may be completed using the finer channelized outputs of channelizing circuit 402 or fine channelizing circuit 412 using a similar concept to that illustrated in FIG. 7.

Methodology

Figure 8:
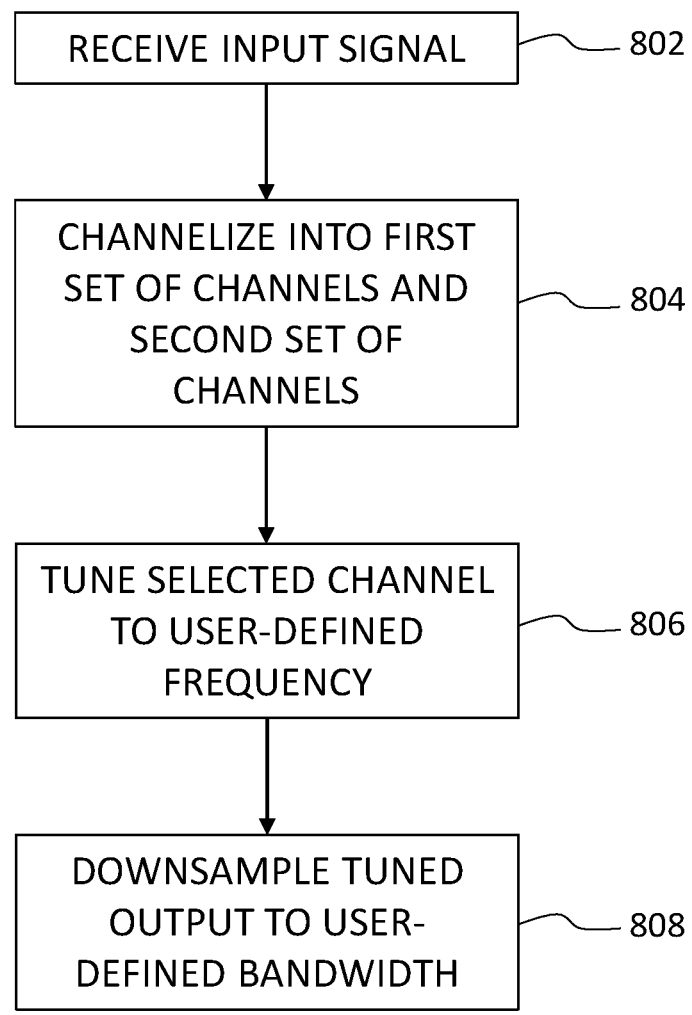
FIG. 8 illustrates a flowchart of a method of channelizing an input signal, in accordance with an embodiment of the present disclosure.

FIG. 8 is a flowchart illustrating an example method 800 of channelizing an input signal, in accordance with certain embodiments of the present disclosure. As can be seen, the example method includes a number of phases and sub-processes, the sequence of which may vary from one embodiment to another. However, when considered in the aggregate, these phases and sub-processes form a process for guiding a projectile in accordance with certain of the embodiments disclosed herein. These embodiments can be implemented, for example using the digital signal processor illustrated in FIG. 4, as described above. However other system architectures can be used in other embodiments, as will be apparent in light of this disclosure. To this end, the correlation of the various functions shown in FIG. 8 to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module having decoupled sub-modules can be used to perform all of the functions of method 800. Thus, other embodiments may have fewer or more modules and/or sub-modules depending on the granularity of implementation. In still other embodiments, the methodology depicted can be implemented as a computer program product including one or more non-transitory machine-readable mediums that when executed by one or more processors cause the methodology to be carried out. Numerous variations and alternative configurations will be apparent in light of this disclosure.

Method 800 may begin at operation 802 where an input signal having a first bandwidth is received. The input signal may have a bandwidth around 80 MHz or higher, and may be received from across a network, such as an ethernet network. In some embodiments the input signal adheres to the VITA 49.2 protocol and would need to be conditioned to remove associated protocol headers before the input signal can be further processed.

Method 800 continues with operation 804 where the input signal is channelized into at least a first set of channels and a second set of channels. Each of the first set of channels and second set of channels may be provided as separate outputs from a channelizing circuit. The first set of channels may be larger than the second set of channels and have a smaller bandwidth per channel compared to the second set of channels. In one example, the first set of channels includes 160 channels having a channel bandwidth of about 1.625 MHz and the second set of channels includes 16 channels having a channel bandwidth of about 16.25 MHz. According to an embodiment, the channelization process overlaps the bandwidths of adjacent channels in both the first set of channels and a second set of channels. In some embodiments, a third set of channels are generated by a fine channelizing circuit, the third set of channels having more channels than either the first set of channels or the second set of channels. The fine channelizing circuit may only be used if a small bandwidth (e.g., bandwidths less than 100 kHz) is requested by a user.

Method 800 continues with operation 806 where one channel of the plurality of channels generated from operation 804 is selected and tuned to a user-defined, or predefined, center frequency. The channel selection may be used to provide a channel from the plurality of channels, that includes the requested center frequency and includes enough bandwidth to support the requested bandwidth. Requests for high bandwidth signals (e.g., requests for bandwidths greater than about 2 MHz) may be satisfied by choosing a channel from the coarsest channelized output (e.g., the second set of channels). In another example, requests for very low bandwidths (e.g., less than 0.1 MHz) may be satisfied by choosing a channel from the finest channelized output (e.g., the third set of channels). According to some embodiments, the requested bandwidth may only be chosen from a finite selection of bandwidths. Higher numbers of possible bandwidth values can also be achieved with the proper architecture and computational power. Once the proper channel is selected, a tuner may be used to tune the channel to align with the requested center frequency.

Method 800 continues with operation 808 where the selected and tuned channel is further downsampled to match the requested signal bandwidth to one of the chosen finite bandwidth values. The downsampling may be a fractional downsampling operation that reduces the bandwidth of a selected channel by as low as $1/16$, $1/32$, $1/64$, or $1/128$. Other fractional downsampling rates are possible as well based on the design of the filter blocks, and/or by cascading filter blocks.

Example Computing System

Figure 9:
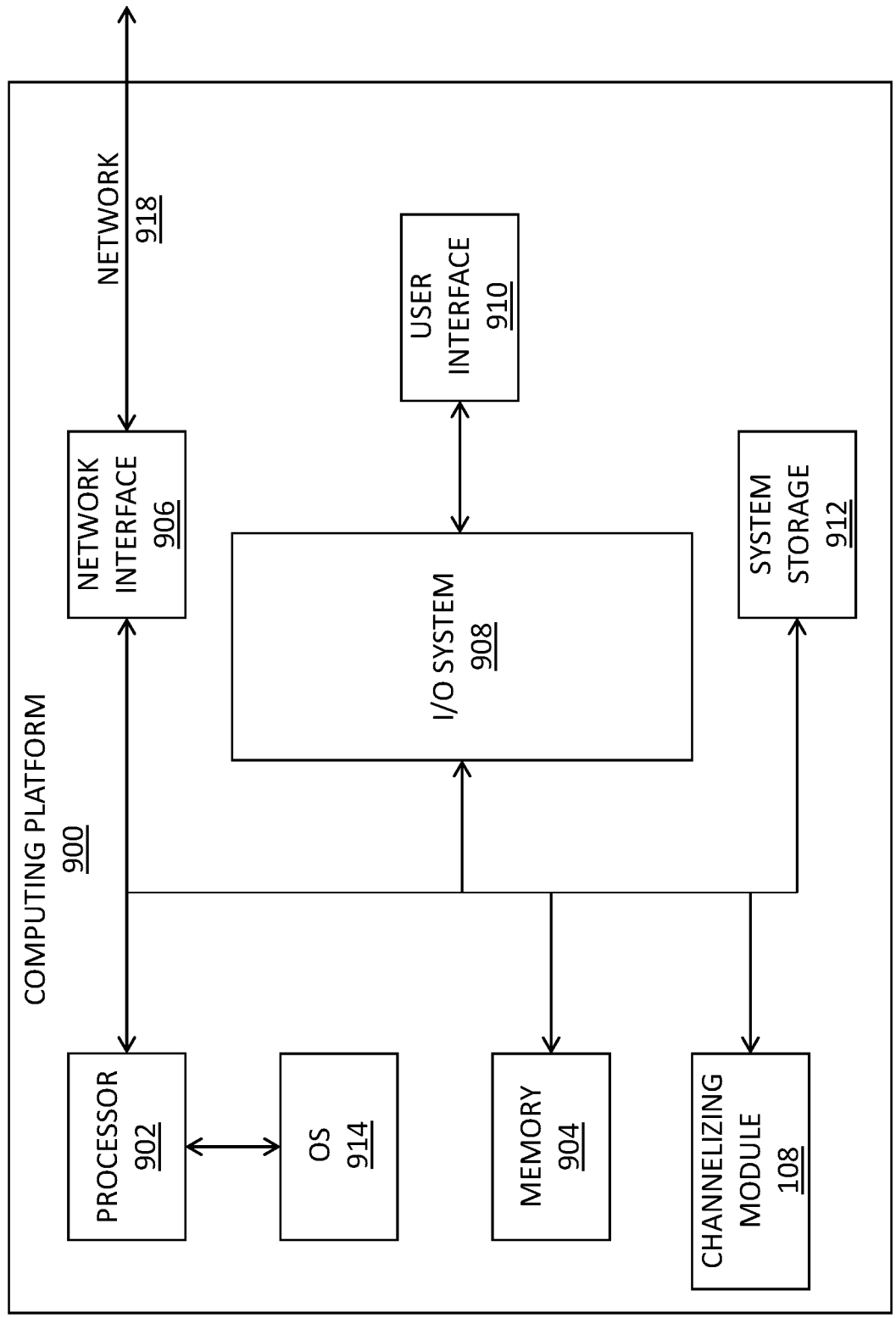
FIG. 9 illustrates an example computer system that can implement a channelizing module, in accordance with an embodiment of the present disclosure.

FIG. 9 illustrates an example computing platform 900 that interfaces with a channelizing module 108, configured in accordance with certain embodiments of the present disclosure. In some embodiments, computing platform 900 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, computing platform 900 may comprise any combination of a processor 902, a memory 904, channelizing module 108, a network interface 906, an input/output (I/O) system 908, a user interface 910, and a storage system 912. As can be further seen, a bus and/or interconnect is also provided to allow for communication between the various components listed above and/or other components not shown. Computing platform 900 can be coupled to a network 918 through network interface 906 to allow for communications with other computing devices, platforms, or resources. Other componentry and functionality not reflected in the block diagram of FIG. 9 will be apparent in light of this disclosure, and it will be appreciated that other embodiments are not limited to any particular hardware configuration.

Processor 902 can be any suitable processor and may include one or more coprocessors or controllers to assist in control and processing operations associated with computing system 900. In some embodiments, processor 902 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code.

The processors may be multithreaded cores in that they may include more than one hardware thread context (or "logical processor") per core.

Memory 904 can be implemented using any suitable type of digital storage including, for example, flash memory and/or random access memory (RAM). In some embodiments, memory 904 may include various layers of memory hierarchy and/or memory caches as are known to those of skill in the art. Memory 904 may be implemented as a volatile memory device such as, but not limited to, a RAM, dynamic RAM (DRAM), or static RAM (SRAM) device. Storage system 912 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 912 may comprise technology to increase the storage performance enhanced protection for valuable digital media when multiple hard drives are included.

Processor 902 may be configured to execute an Operating System (OS) 914 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with computing system 900, and therefore may also be implemented using any suitable existing or subsequently-developed platform.

Network interface 906 can be any appropriate network chip or chipset which allows for wired and/or wireless connection between other components of computing platform 900 and/or network 918, thereby enabling computing platform 900 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 908 may be configured to interface between various I/O devices and other components of computing platform 900. I/O devices may include, but not be limited to, a user interface 910. User interface 910 may include devices (not shown) such as a display element, touchpad, keyboard, mouse, and speaker, etc. I/O system 908 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 902 or any chipset of computing platform 900. In some embodiments, I/O system 908 also receives requests, via user interface 910, for bandwidth portions of a received input signal.

It will be appreciated that in some embodiments, the various components of the computing platform 900 may be combined or integrated in a system-on-a-chip (SoC) architecture. In some embodiments, the components may be hardware components, firmware components, software components or any suitable combination of hardware, firmware or software.

In various embodiments, computing platform 900 may be implemented as a wireless system, a wired system, or a combination of both. When implemented as a wireless system, computing platform 900 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, computing platform 900 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Some of the embodiments discussed herein may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Further Example Embodiments

The following examples pertain to further embodiments, from which numerous permutations and configurations will be apparent.

Example 1 is a channelizing module that includes an input interface configured to receive an input signal having a first frequency bandwidth, one or more switching circuits, a routing module, and a digital signal processor. The one or more switching circuits is configured to route the input signal to a destination chosen between at least two possible destinations. The routing module is configured to receive the input signal and select an output path for the input signal amongst a plurality of output paths. The digital signal processor is configured to receive the input signal and to downsample the input signal into a plurality of output signals each having a frequency bandwidth smaller than the first frequency bandwidth. The plurality of output signals are received by the one or more switching circuits, the one or more switching circuits being further configured to select between outputting the plurality of output signals and outputting other signals received from the digital signal processor.

Example 2 includes the subject matter of Example 1, wherein at least one output path of the plurality of output paths bypasses the digital signal processor.

Example 3 includes the subject matter of Example 2, wherein the at least one output path routes to a switching circuit of the one or more switching circuits.

Example 4 includes the subject matter of any one of Examples 1-3, wherein the input interface is configured to interface with an ethernet switch.

Example 5 includes the subject matter of any one of Examples 1-4, further comprising a system bus coupled to at least the digital signal processor, the routing module, and the one or more switching circuits.

Example 6 includes the subject matter of Example 5, wherein the at least two possible destinations comprises the system bus and the digital signal processor.

Example 7 includes the subject matter of any one of Examples 1-6, wherein the input signal adheres to a VITA 49.2 protocol.

Example 8 includes the subject matter of any one of Examples 1-7, wherein the plurality of output signals each adheres to a VITA 49.2 protocol.

Example 9 is a channelizing system that includes an input interface configured to receive an input signal having a first frequency bandwidth and a digital signal processor. The digital signal processor is configured to channelize the input signal and includes a channelizer circuit and a plurality of tuning modules. The channelizer circuit is configured to receive the input signal having a first bandwidth and to channelize the input signal into a first set of channels each having a bandwidth smaller than the first bandwidth as a first output signal and into a second set of channels having a bandwidth smaller than the first bandwidth as a second output signal. The plurality of tuning modules are configured to receive one or more channels from the first output signal or the second output signal and to further downsample the one or more channels to a user-defined bandwidth at a user-defined center frequency.

Example 10 includes the subject matter of Example 9, wherein the first set of channels is greater than the second set of channels.

Example 11 includes the subject matter of Example 9 or 10, wherein each of the first of channels has a smaller bandwidth per channel compared to the second set of channels.

Example 12 includes the subject matter of any one of Examples 9-11, wherein the channelizer circuit is a first channelizer circuit, and the digital signal processor further comprises a second channelizer circuit.

Example 13 includes the subject matter of Example 12, further comprising a fine channelizer circuit configured to receive an output from the first channelizer circuit and an output from the second channelizer circuit and configured to generate an output signal having a third set of channels greater than the first set of channels and the second set of channels.

Example 14 includes the subject matter of Example 13, wherein the third set of channels each has a smaller bandwidth per channel compared to either the first set of channels or the second set of channels.

Example 15 includes the subject matter of any one of Examples 9-14, wherein the channelizer circuit comprises one or more weighted-overlap-add digital filters configured to expand a bandwidth of each of the channels of the first set of channels and each of the channels of the second set of channels, such that the bandwidth of adjacent channels overlaps.

Example 16 includes the subject matter of any one of Examples 9-15, wherein each of the plurality of tuning modules comprises a plurality of FIR filter blocks, and a memory having a plurality of FIR filter coefficients.

Example 17 includes the subject matter of Example 16, wherein one or more of the plurality of FIR filter blocks comprises a tuner circuit configured to tune an input signal received by the one or more of the plurality of FIR filter blocks to a user-defined center frequency within a chosen one of the first set of channels or the second set of channels.

Example 18 includes the subject matter of Example 16, wherein one or more of the plurality of FIR filter blocks is configured to perform fractional downsampling as low as $\frac{1}{32}$ of the bandwidth of the input signal received by the one or more of the plurality of FIR filter blocks, wherein the input signal corresponds to a chosen one of the first set of channels or the second set of channels.

Example 19 is a digital signal processor configured to channelize an input signal. The digital signal processor includes a channelizer circuit and a plurality of tuning modules. The channelizer circuit is configured to receive the input signal having a first bandwidth and to channelize the input signal into a first set of channels each having a bandwidth smaller than the first bandwidth as a first output signal and into a second set of channels having a bandwidth smaller than the first bandwidth as a second output signal. The plurality of tuning modules are configured to receive one or more channels from the first output signal or the second output signal and to further downsample the one or more channels to a user-defined bandwidth at a user-defined center frequency.

Example 20 includes the subject matter of Example 19, wherein the first set of channels is greater than the second set of channels.

Example 21 includes the subject matter of Example 20, wherein the first set of channels each has a smaller bandwidth per channel compared to the second set of channels.

Example 22 includes the subject matter of any one of Examples 19-21, wherein the channelizer circuit is a first channelizer circuit, and the digital signal processor further comprises a second channelizer circuit.

Example 23 includes the subject matter of Example 22, further comprising a fine channelizer circuit configured to receive an output from the first channelizer circuit and an output from the second channelizer circuit and configured to generate an output signal having a third set of channels greater than the first set of channels and the second set of channels.

Example 24 includes the subject matter of Example 23, wherein the third set of channels each has a smaller bandwidth per channel compared to either the first set of channels or the second set of channels.

Example 25 includes the subject matter of any one of Examples 19-24, wherein the channelizer circuit comprises one or more weighted-overlap-add digital filters configured to expand the bandwidth of each of the channels of the first set of channels and each of the channels of the second set of channels, such that the bandwidth of adjacent channels overlaps.

Example 26 includes the subject matter of any one of Examples 19-25, wherein each of the plurality of tuning modules comprises a plurality of FIR filter blocks, and a memory having a plurality of FIR filter coefficients.

Example 27 includes the subject matter of Example 26, wherein one or more of the plurality of FIR filter blocks comprises a tuner circuit configured to tune an input signal received by the one or more of the plurality of FIR filter blocks to a user-defined center frequency within a chosen one of the first set of channels or the second set of channels.

Example 28 includes the subject matter of Example 26, wherein one or more of the plurality of FIR filter blocks is configured to perform fractional downsampling as low as $\frac{1}{32}$ of the bandwidth of an input signal received by the one or more of the plurality of FIR filter blocks, wherein the input signal corresponds to a chosen one of the first set of channels or the second set of channels.

Example 29 is a method of channelizing an input signal. The method includes receiving the input signal at a digital signal processor; channelizing the input signal into at least a first output signal having a first set of channels and a second output signal having a second set of channels; tuning a selected channel of either the first output signal or the second output signal to produce a third output signal having a user-defined center frequency; and downsampling the third output signal to a user-defined bandwidth to produce a fourth output signal having a user-defined center frequency and a user-defined bandwidth.

Example 30 includes the subject matter of Example 29, further comprising selecting the user-defined bandwidth from amongst a finite number of bandwidth values.

Example 31 includes the subject matter of Example 29 or 30, further comprising channelizing the first output signal or the second output signal into a fifth output signal having a third set of channels greater than the first set of channels and the second set of channels.

Example 32 includes the subject matter of Example 31, wherein the tuning comprises tuning a selected channel from either the first output signal, the second output signal, or the fifth output signal to produce the third output signal having a user-defined center frequency.

Example 33 includes the subject matter of any one of Examples 29-32, wherein the channelizing comprises filtering the input signal using one or more weighed-overlap-add digital filters, such that a bandwidth of adjacent channels of the first set of channels overlaps and a bandwidth of adjacent channels of the second set of channels overlaps.

Example 34 includes the subject matter of any one of Examples 29-33, further comprising storing the first output signal or the second output signal in a memory.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be appreciated, however, that the embodiments may be practiced without these specific details. In other instances, well known operations, components and circuits have not been described in detail so as not to obscure the embodiments. It can be further appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:

1. A channelizing system comprising:
an input interface configured to receive an input signal having a first frequency bandwidth; and
a digital signal processor configured to channelize the input signal, the digital signal processor comprising:
a channelizer circuit configured to receive the input signal having a first bandwidth and to channelize the input signal into a first set of channels each having a bandwidth smaller than the first bandwidth as a first output signal and into a second set of channels having a bandwidth smaller than the first bandwidth as a second output signal, wherein the channelizer circuit is a first channelizer circuit, and the digital signal processor further comprises a second channelizer circuit, and wherein the channelizer circuit further comprises a fine channelizer circuit configured to receive an output from the first channelizer circuit and an output from the second channelizer circuit and configured to generate an output signal having a third set of channels greater than the first set of channels and the second set of channels; and
a plurality of tuning modules configured to receive one or more channels from the first output signal or the second output signal and to further downsample the one or more channels to a user-defined bandwidth at a user-defined center frequency.

2. The channelizing system of claim 1, wherein the first set of channels is greater than the second set of channels.

3. The channelizing system of claim 1, wherein each of the first of channels has a smaller bandwidth per channel compared to the second set of channels.

4. The channelizing system of claim 1, wherein the third set of channels each has a smaller bandwidth per channel compared to either the first set of channels or the second set of channels.

5. The channelizing system of claim 1, wherein the channelizer circuit comprises one or more weighted-overlap-add digital filters configured to expand a bandwidth of each of the channels of the first set of channels and each of the channels of the second set of channels, such that the bandwidth of adjacent channels overlaps.

6. The channelizing system of claim 1, wherein each of the plurality of tuning modules comprises:
a plurality of FIR filter blocks, and
a memory having a plurality of FIR filter coefficients.

7. The channelizing system of claim 6, wherein one or more of the plurality of FIR filter blocks comprises a tuner circuit configured to tune an input signal received by the one or more of the plurality of FIR filter blocks to a user-defined center frequency within a chosen one of the first set of channels or the second set of channels.

8. A digital signal processor configured to channelize an input signal, the digital signal processor comprising:
a channelizer circuit configured to receive the input signal having a first bandwidth and to channelize the input signal into a first set of channels each having a bandwidth smaller than the first bandwidth as a first output signal and into a second set of channels having a bandwidth smaller than the first bandwidth as a second output signal, wherein the channelizer circuit is a first channelizer circuit, and the digital signal processor further comprises a second channelizer circuit, and wherein the channelizer circuit further comprises a fine channelizer circuit configured to receive an output from the first channelizer circuit and an output from the second channelizer circuit and configured to generate an output signal having a third set of channels greater than the first set of channels and the second set of channels; and
a plurality of tuning modules configured to receive one or more channels from the first output signal or the second output signal and to further downsample the one or more channels to a user-defined bandwidth at a user-defined center frequency.

9. The digital signal processor of claim 8, wherein the first set of channels is greater than the second set of channels.

10. The digital signal processor of claim 9, wherein the first set of channels each has a smaller bandwidth per channel compared to the second set of channels.

11. The digital signal processor of claim 8, wherein the third set of channels each has a smaller bandwidth per channel compared to either the first set of channels or the second set of channels.

12. The digital signal processor of claim 8, wherein the channelizer circuit comprises one or more weighted-overlap-add digital filters configured to expand the bandwidth of each of the channels of the first set of channels and each of the channels of the second set of channels, such that the bandwidth of adjacent channels overlaps.

13. The digital signal processor of claim 8, wherein each of the plurality of tuning modules comprises:
a plurality of FIR filter blocks, and
a memory having a plurality of FIR filter coefficients.

14. The digital signal processor of claim 13, wherein one or more of the plurality of FIR filter blocks comprises a tuner circuit configured to tune an input signal received by the one or more of the plurality of FIR filter blocks to a user-defined center frequency within a chosen one of the first set of channels or the second set of channels.

15. A method of channelizing an input signal, comprising:
receiving the input signal at a digital signal processor;

channelizing the input signal into at least a first output signal having a first set of channels and a second output signal having a second set of channels;

tuning a selected channel of either the first output signal or the second output signal to produce a third output signal having a user-defined center frequency;

downsampling the third output signal to a user-defined bandwidth to produce a fourth output signal having a user-defined center frequency and a user-defined bandwidth; and channelizing the first output signal or the second output signal into a fifth output signal having a third set of channels greater than the first set of channels and the second set of channels.

16. The method of claim 15, further comprising selecting the user-defined bandwidth from amongst a finite number of bandwidth values.

17. The method of claim 15, wherein the tuning comprises tuning a selected channel from either the first output signal, the second output signal, or the fifth output signal to produce the third output signal having a user-defined center frequency.

18. The method of claim 15, wherein the channelizing comprises filtering the input signal using one or more weighed-overlap-add digital filters, such that a bandwidth of adjacent channels of the first set of channels overlaps and a bandwidth of adjacent channels of the second set of channels overlaps.

* * * * *